United States Patent [19]
Short

[11] 3,917,487
[45] Nov. 4, 1975

[54] CADMIUM-CONTAINING SILVER CONDUCTOR COMPOSITIONS

[75] Inventor: Oliver Alton Short, Wilmington, Del.

[73] Assignee: E. I. Du Pont de Nemours & Company, Wilmington, Del.

[22] Filed: Dec. 28, 1973

[21] Appl. No.: 429,077

[52] U.S. Cl. ............ 106/1; 117/123 B; 117/124 C; 117/227; 252/514
[51] Int. Cl.² .......................................... C09D 5/24
[58] Field of Search ......... 106/1; 117/123 B, 124 C, 117/227; 252/514

[56] References Cited
UNITED STATES PATENTS

| | | | |
|---|---|---|---|
| 2,961,416 | 11/1960 | Baldrey et al. | 252/514 |
| 3,484,284 | 12/1969 | Dates et al. | 106/1 |
| 3,679,439 | 7/1972 | Milgram | 106/1 |

*Primary Examiner*—Lorenzo B. Hayes

[57] ABSTRACT

Improved silver conductor compositions comprising, in addition to silver and inorganic binder (such as glass and $Bi_2O_3$), cadmium, whereby the solder leach resistance of resultant conductors is enhanced. Also dispersions thereof in inert vehicle and ceramic substrates having the conductor composition in adherent relationship therewith.

6 Claims, No Drawings

CADMIUM-CONTAINING SILVER CONDUCTOR COMPOSITIONS

BACKGROUND OF THE INVENTION

Metallizing compositions or paints used in metallizing ceramic surfaces for electrical purposes must be fired on the surfaces at a temperature sufficiently high to produce good adhesion, good capacitance and a low dissipation factor. In addition, the fired-on metallizations must be readily solderable to electrical lead wires or other metallic connectors (i.e., have solder wettability); the metallizations must have good solder leach resistance when exposed to molten solder. Especially desireable are such conductor compositions which can withstand longer residence in a molten solder bath. The lead-containing noble metal compositions of U.S. Pat. No. 3,679,439, issued July 25, 1972, are improved over compositions containing no lead, but further improvement in solder leach resistance is needed in commercial conductors.

SUMMARY OF THE INVENTION

In compositions comprising finely divided silver and inorganic binder, useful for producing conductive patterns on a dielectric substrate, this invention provides improved compositions additionally comprising cadmium, as finely divided elemental powder, the amount of cadmium being an amount effective to increase the solder leach resistance of conductors thereof.

Often the compositions of this invention will comprise 2–20 percent by weight cadmium, based on the weight of silver. Also a part of this invention are dispersions of such compositions in an inert liquid vehicle, and ceramic dielectric substrates having the conductor composition in adherent relationship thereto, that is, the compositions are sintered (fired) to form an electrically continuous pattern on the substrate.

DETAILED DESCRIPTION

The silver metallizing compositions in which I have made an improvement have varying silver contents, depending upon the desired resultant electrical properties, but with a silver content in excess of 30% of the total weight of metal and inorganic binder. Furthermore, the percent solids (metals and inorganic binder) in the metallizing composition can be modified to suit the particular application which is involved. Metallizing compositions generally are of such a particle size that they can be applied by screen printing techniques. Typically, the inorganic powders (solids) metallizing compositions, including those of this invention, are of a size small enough to pass through a screen in the size range No. 200-No. 400 (U.S. standard sieve scale), as indicated in the art, e.g., Miller U.S. Pat. No. 3,374,110.

The metallizing compositions contain an inorganic binder. Any inorganic material which serves to bind metals to the substrate and to one another can be used as the inorganic binder. The amount of inorganic binder present should always be sufficient to provide adequate adhesion of the metals to the substrate. The inorganic binder can be any of the glass frits employed in metallizing compositions. Such frits are generally prepared by melting a glass batch of desired metal oxides, or compound which will produce the glass during melting, and pouring the melt into water. The coarse frit is then milled to a powder of the desired fineness.

The patents to Larsen and Short, U.S. Pat. No. 2,822,279, and to Hoffman, U.S. Pat. No. 3,207,706, describe some frit compositions which can be employed. Typical frit compositions usable as binders in the compositions of this invention include: lead borate, lead silicate, lead borosilicate, cadmium borate, lead-cadmium borosilicate, zinc borosilicate and sodium-cadmium borosilicate frits. The glass frit may be used alone, or together with a wetting agent such as $Bi_2O_3$. It is pointed out that the presence of the additives of the present invention may eliminate the need for a wetting agent. Consequently, a wetting agent is an optional constituent in the metallizing compositions of this invention.

The essential feature of the present invention is the incorporation in such silver compositions of cadmium as the element. The amount of cadmium employed is an amount effective to increase the solder leach resistance of the resultant conductor pattern adherent to a ceramic dielectric substrate. Such conductor patterns are made adherent to the substrate by firing (sintering) the composition at a temperature below the melting point of silver. Normally, there is at least 2% cadmium present, based on silver, to cause an appreciable increase in solder leach resistance, but normally not more than 20%, due to oxidation of cadmium during firing and consequent reduced solderability. This 2–20% range for cadmium is for purposes of practicality only, and not of the essence of my invention.

The metallizing compositions of this invention will usually, although not necessarily, be dispersed in an inert liquid vehicle to form a paint or paste for application to ceramic dielectric substrates. The proportion of vehicle to solids may vary considerably upon the manner in which the paint or paste is to be applied and the kind of vehicle used. Any liquid, preferably one that is inert towards the noble metal and inorganic binder, may be employed as the vehicle. Water or any of the various organic liquids, with or without resin binders, thickening and/or stabilizing agents, and/or other common additives may be utilized as the vehicle. Examples of organic liquids that can be used are esters of higher alcohols, for example, the acetates and propionates; the terpenes such as pine oil, terpineol and the like; and solutions of resin binders such as the polymethacrylates of lower alcohols, or solutions of ethyl cellulose, and solvents such as pine oil and the monobutyl ether of ethylene glycol monoacetate (butyl-O-$CH_2CH_2$-$OCOCH_3$). Vehicles disclosed in U.S. Pat. No. 3,536,508, issued Oct. 27, 1970, may be used. The vehicle may contain or be composed of volatile liquids to promote fast setting after application, or it may contain waxes, thermoplastic resins or the like materials which are thermofluid so that the vehicle-containing composition may be applied at an elevated temperature to a relatively cold ceramic body upon which the composition sets immediately.

The metallizing compositions can be applied and fired onto various types of ceramic dielectrics, including those composed of forsterite, steatite, titanium oxide, barium titanate, alumina or zircon porcelain. Any other conventional unfired (green) dielectrics or prefired dielectrics can be used. The metallizing compositions can be applied by any of the conventional techniques, including screen printing, brushing, brush/-band, spraying or dipping.

Conventional thick-film techniques commonly employed are described in "Handbook of Materials and Processes for Electronics," C. A. Harper, editor, McGraw-Hill, N.Y., 1970, Chapter 12. The invention is further illustrated by the following examples. In the examples and elsewhere in the specification all parts, ratios and percentages of material or components are by weight.

EXAMPLE 1

As a comparative showing, a composition containing 50 percent silver powder, 2¼ percent of a cadmium borosilicate frit, 9 percent bismuth oxide and 38¾ percent organic vehicle (10 percent ethyl cellulose and 90 percent pine oil) was printed on ½-inch diameter capacitor wafers. Two standard types of ceramic wafers were used, one composed mostly of barium titanate and the other mostly of titania. The printed wafers were then fired in a belt furnace at 760°C., 45 minutes, 10 minutes at peak. These fired wafers were then dipped in a solder bath containing 62% tin, 36 percent lead, 2 percent silver, held at a temperature of 215°C.±1°. The time to leach the silver pattern from the ceramic chip, to such a degree that solder would no longer wet the printed area, was measured. Using this standard silver composition, the time required for leaching was 65 seconds, for either substrate.

EXAMPLE 2

As a further comparative example, using the compositions of U.S. Pat. No. 3,679,439, a composition similar to that of Example 1 was formulated with 3 percent lead powder added to the composition, with no change other than reduction in the amount of vehicle to compensate for the lead addition (6 percent lead based on silver). The times required to leach the silver from the ceramic wafers were, for barium titanate, 85 seconds and for titanium oxide, 140 seconds. This represents 130 percent and 215 percent, respectively of the performance of the comparative material of Example 1.

EXAMPLE 3

A composition comprising cadmium powder was prepared, printed and fired on capacitor wafers and tested for solder leach resistance as in Example 1. The cadmium was 3 percent of the composition, as was lead in Example 2 (6 percent Cd based on Ag). On barium titanate wafers, leaching occurred in 235 seconds and on titania wafers in 185 seconds. This represents 360 percent and 280 percent, respectively of the performance of the comparative material of Example 1. Solderability was observed to be good in this Example 3.

EXAMPLES 4 and 5

In a similar series of experiments using a higher solder pot temperature (220°C.), two compositions were compared. Fired products prepared as in Example 1 (no additive) leached in 28 seconds. Fired products prepared using 10 percent cadmium powder based on Ag leached in 102 seconds, 400 percent of the standard even at this higher temperature. Solderability was observed to be good.

I claim:

1. In a powder composition, for producing conductive patterns on a dielectric substrate comprising finely divided silver and finely divided inorganic binder, the improvement comprising finely divided elemental cadmium powder in an amount effective to increase the solder leach resistance of conductors thereof.

2. Conductor compositions according to claim 1 wherein the amount of cadmium is 2–20 percent by weight, based on the weight of silver.

3. Conductor compositions according to claim 1 dispersed in an inert vehicle.

4. Conductor compositions according to claim 2 dispersed in an inert vehicle.

5. A ceramic dielectric substrate having the composition of claim 1 in adherent relationship therewith.

6. A ceramic dielectric substrate having the composition of claim 2 in adherent relationship therewith.

* * * * *